(12) United States Patent
Moroz et al.

(10) Patent No.: US 11,776,816 B2
(45) Date of Patent: Oct. 3, 2023

(54) FIN PATTERNING TO REDUCE FIN COLLAPSE AND TRANSISTOR LEAKAGE

(71) Applicant: Synopsys, Inc., Mountain View, CA (US)

(72) Inventors: Victor Moroz, Saratoga, CA (US); Xi-Wei Lin, Fremont, CA (US)

(73) Assignee: Synopsys, Inc., Sunnyvale, CA (US)

( * ) Notice: Subject to any disclaimer, the term of this patent is extended or adjusted under 35 U.S.C. 154(b) by 72 days.

(21) Appl. No.: 17/109,504

(22) Filed: Dec. 2, 2020

(65) Prior Publication Data

US 2022/0172953 A1    Jun. 2, 2022

(51) Int. Cl.

| H01L 21/3065 | (2006.01) |
| H01L 21/308 | (2006.01) |
| G06F 30/392 | (2020.01) |
| G06F 30/398 | (2020.01) |
| H01L 29/66 | (2006.01) |

(52) U.S. Cl.
CPC ........ *H01L 21/3065* (2013.01); *G06F 30/392* (2020.01); *G06F 30/398* (2020.01); *H01L 21/308* (2013.01); *H01L 29/66742* (2013.01); *H01L 29/66795* (2013.01)

(58) Field of Classification Search
CPC ... G06F 30/392; G06F 30/398; H01L 21/308; H01L 29/66742; H01L 29/66795; H01L 21/3065–30655; H01L 21/31116; H01L 21/31122; H01L 21/31138; H01L 21/67069; H01L 21/32136–32137; H01L 21/02071; H01L 21/30621; H01L 21/32; H01L 21/7681; H01L 21/76811; H01L 21/027–0338; H01L 21/314–3185; H01L 21/3081; H01L 21/3086; H01L 29/66818; H01L 21/3063; H01L 21/465; H01L 21/47573; H01L 21/461; H01L 21/467; H01L 21/4828; H01L 21/4832; H01L 21/02098; H01L 21/31055; H01L 21/31056; H01J 2237/334–3348

See application file for complete search history.

(56) References Cited

U.S. PATENT DOCUMENTS

| 2016/0293726 | A1 | 10/2016 | Huang et al. |
| 2017/0069462 | A1 | 3/2017 | Kanarik et al. |
| 2017/0243955 | A1* | 8/2017 | Shinohara ....... H01L 21/823431 |
| 2017/0345915 | A1 | 11/2017 | Coquand et al. |
| 2018/0012993 | A1 | 1/2018 | Cheng et al. |
| 2018/0102436 | A1 | 4/2018 | Chiang et al. |
| 2020/0176591 | A1 | 6/2020 | Wong et al. |
| 2021/0351080 | A1* | 11/2021 | Tsai ................. H01L 21/30604 |
| 2021/0391449 | A1* | 12/2021 | Liao .................... H01L 29/0847 |
| 2022/0157664 | A1* | 5/2022 | Chang ............ H01L 21/823878 |

FOREIGN PATENT DOCUMENTS

CN    107331614 A    11/2017

OTHER PUBLICATIONS

"Atomic Layer Etching of Si(100) and Si(111) Using Cl2 and Ar Neutral Beam", S. D. Park, D. H. Lee, and G. Y. Yeoma; Jun. 7, 2005; Electrochemical and Solid-State Letters, 8(8), pp. 0106-0109. (Year: 2005).*

* cited by examiner

*Primary Examiner* — Cuong B Nguyen
(74) *Attorney, Agent, or Firm* — Park, Vaughan, Fleming & Dowler LLP; Laxman Sahasrabuddhe

(57) ABSTRACT

At least one fin structure may be created on a silicon substrate. Next, a width of the at least one fin structure may be decreased by applying one or more iterations of a self-limiting fin etch process.

20 Claims, 10 Drawing Sheets

US 11,776,816 B2

FIN PATTERNING TO REDUCE FIN COLLAPSE AND TRANSISTOR LEAKAGE

TECHNICAL FIELD

The present disclosure relates to semiconductor devices. More specifically, the present disclosure relates to fin patterning to reduce fin collapse and transistor leakage.

BACKGROUND

An increasing demand for computing and storage capacity has fueled an increase in the device density of integrated circuit (IC) designs. The semiconductor manufacturing industry has increased the device density of IC designs by decreasing feature sizes.

SUMMARY

Some embodiments described herein may create at least one fin structure on a silicon substrate. Specifically, a fin hardmask pattern may be formed on a silicon substrate, where each feature on the fin hardmask pattern may include a thermal oxide layer disposed on the silicon substrate (e.g., by growing the thermal oxide layer on the silicon substrate), a silicon nitride layer disposed on the thermal oxide layer, and an oxide layer disposed on the silicon nitride layer. Next, a fin etch process may be used to create at least one fin structure on the silicon substrate. The embodiments may then decrease a width of the at least one fin structure by applying one or more iterations of a self-limiting fin etch process. Specifically, in each iteration of the self-limiting fin etch process, a self-limiting absorption process may be applied to the at least one fin structure, and then a self-limiting removal process may be applied to the at least one fin structure.

In some embodiments, applying the self-limiting absorption process to the at least one fin structure may include exposing the at least one fin structure to a chemical that only binds to an outermost atomic layer of the at least one fin structure. In some embodiments, applying the self-limiting removal process to the at least one fin structure may include removing only an outermost atomic layer of the at least one fin structure. In some embodiments, a gate structure may be created that wraps around the at least one fin structure. In some embodiments, the fin structure may be part of a Fin Field Effect Transistor (FinFET) device. In some embodiments, the fin structure may be part of a Gate All Around (GAA) device.

BRIEF DESCRIPTION OF THE FIGURES

The disclosure may be understood based on the detailed description given below and the accompanying figures. The figures are for illustrative purposes, and do not limit the scope of the disclosure. Furthermore, the figures are not necessarily drawn to scale.

DETAILED DESCRIPTION

Aspects of the present disclosure relate to fin patterning to reduce fin collapse and transistor leakage. 3D device technology may help meet future computing and storage demands. In 3D devices, device structures (called fins) may be extended a direction away from the silicon wafer surface. 3D devices may help the semiconductor manufacturing industry to continue increasing device densities in ICs, while allowing optimization of both performance and power when compared to traditional planar device designs.

Existing processes for creating fins may cause manufacturing problems. In particular, existing processes may cause fin widths to vary significantly from a nominal width, which may cause fin collapse (if the fin is too narrow) or may cause excessive transistor leakage (if the fin is too wide). These manufacturing problems may prevent further reduction of 3D device feature sizes.

Embodiments described herein feature a high yield process for creating fins with a desired width. Advantages of embodiments described herein include, but are not limited to, increasing yield of 3D device manufacturing, increasing transistor performance, reducing transistor leakage, and enabling scaling of transistor densities.

In this disclosure, without loss of generality, the wafer surface is assumed to be parallel to the XY plane, the length of a structure along the X direction is referred to as the width of the structure, the length of the structure along the Y direction is referred to as the length of the structure, and the length of the structure along the Z direction is referred to as the height of the structure.

Figure 1:
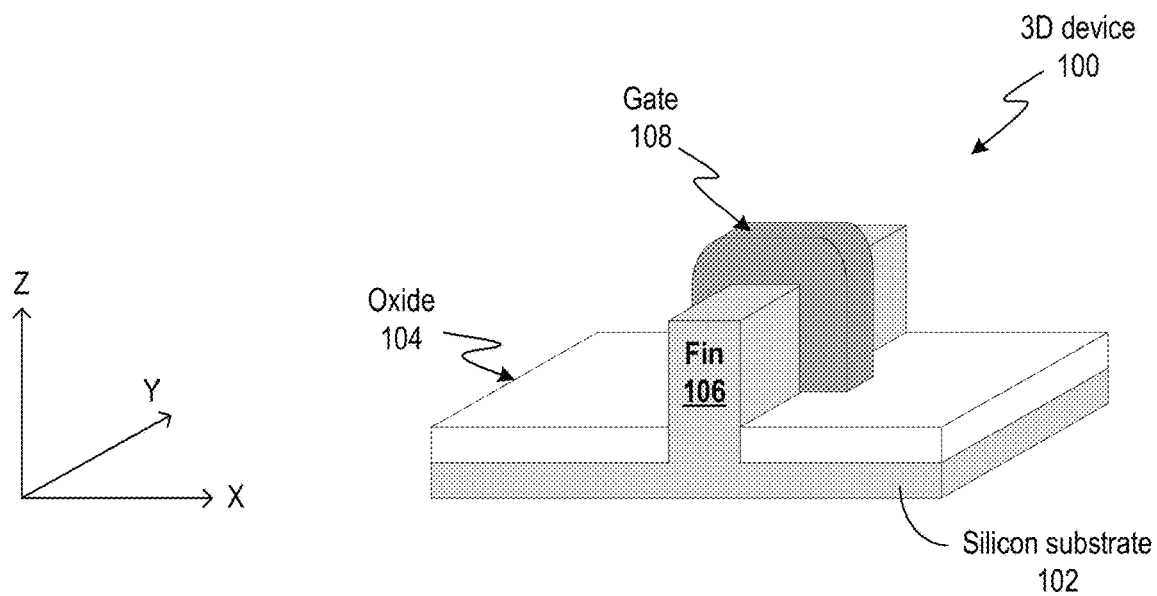
FIG. 1 illustrates a three-dimensional (3D) device in accordance with some embodiments disclosed herein.

FIG. 1 illustrates a 3D device in accordance with some embodiments disclosed herein.

In this disclosure, the term "fin" refers to a structure that rises above the wafer surface, and that includes a conducting channel. In some embodiments, the width of a fin is less than the length of the fin, and is also less than the height of the fin. The amount of current passing through the conducting channel in the fin may be modulated by applying a voltage across the conducting channel. For example, 3D device 100 includes fin 106 that rises above silicon substrate 102 and oxide layer 104. Gate 108 may wrap around the conducting channel in fin 106. The current passing through fin 106 along the Y-direction may be controlled by using the voltage of gate 108. Because gate 108 wraps around fin 106, the surface area of the boundary between gate 108 and fin 106 is larger than a traditional planar device with the same X and Y dimensions, which enables 3D device 100 to have lower threshold voltages and lower leakage currents than similarly sized planar devices.

3D device 100 is an example of a FinFET. Although some embodiments in this disclosure are described in the context of a FinFET, the embodiments are generally applicable to any 3D device that includes fin structures. For example, embodiments described herein are applicable to Gate All Around (GAA) transistors which also include fin structures.

Performance and manufacturability of the 3D device may depend on the fin width. It is desirable for a fin to be narrow so that the gate has excellent control of the current passing through the fin, and very little current leaks through the body of the 3D device when the 3D device is in the off state. However, if the fin is too narrow, it may be vulnerable to collapse, which may affect yield. On the other hand, if the fin is too wide, the 3D device may have excessive leakage, which may affect power consumption and battery lifetime. The term "fin collapse" refers to the absence of a viable fin structure. In other words, if a fin collapse occurs during manufacturing, the resulting 3D device does not operate as desired. The term "yield" refers to the fraction of manufactured 3D devices that operate as desired.

During manufacturing, it is impossible to avoid some fin width variability. Specifically, the actual width of a fin may be different from a nominal width due to random variations that occur during manufacturing. The term "nominal width" refers to the expected width of the manufactured fin if no random variations occur during manufacturing.

Figure 2A:
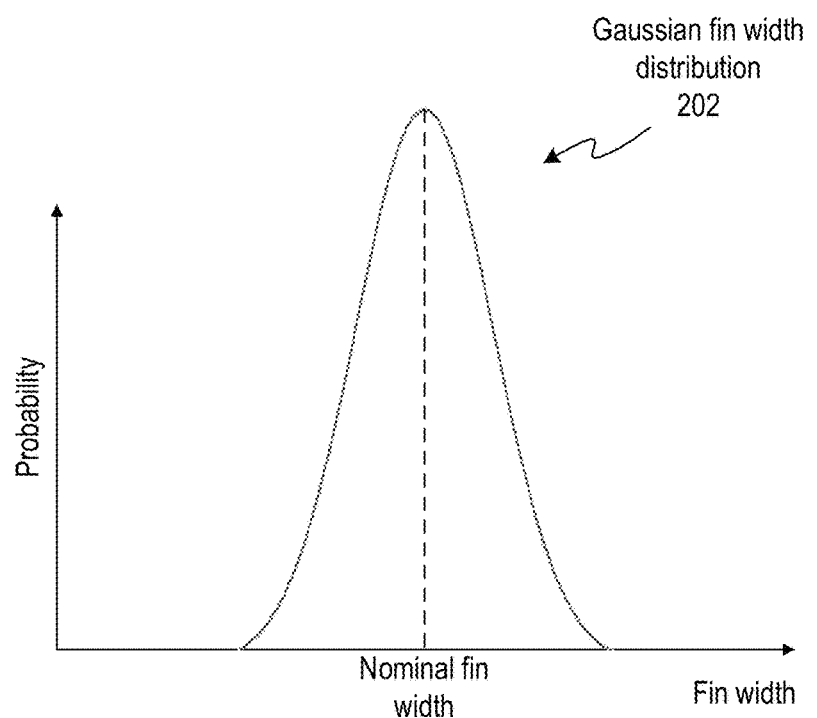
FIG. 2A illustrates a plot of a Gaussian fin width distribution in accordance with some embodiments disclosed herein.
Figure 2B:
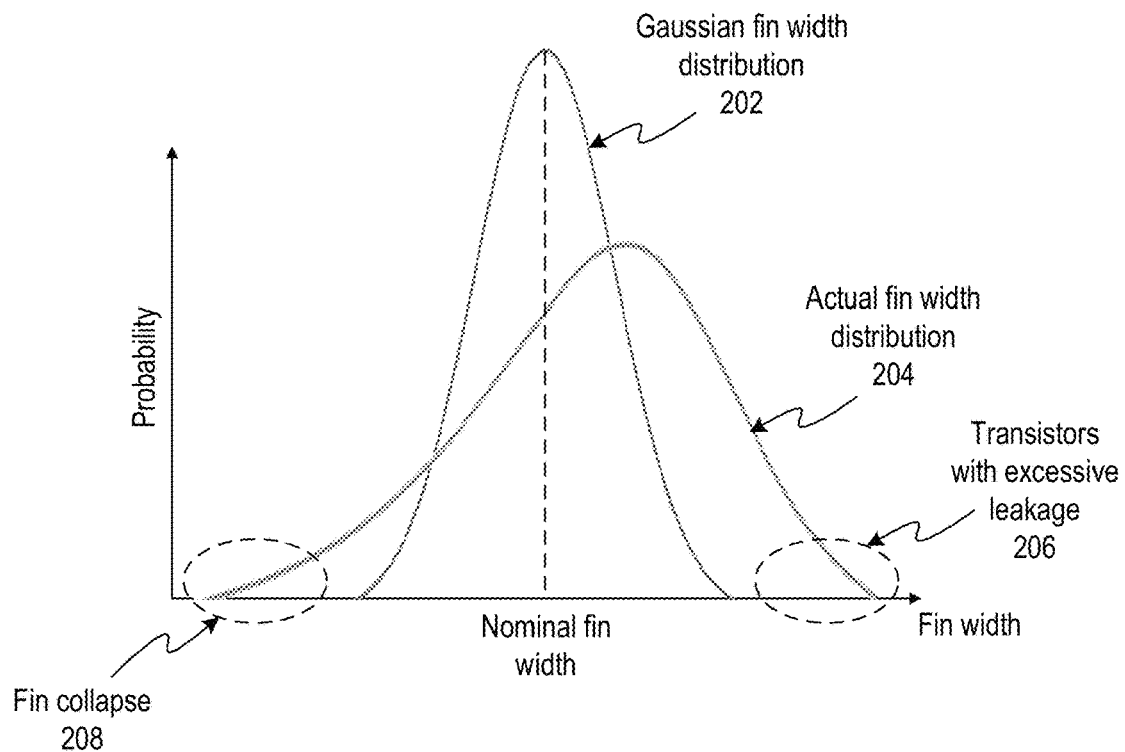
FIG. 2B illustrates a plot of an actual fin width distribution in accordance with some embodiments disclosed herein.
Figure 2C:
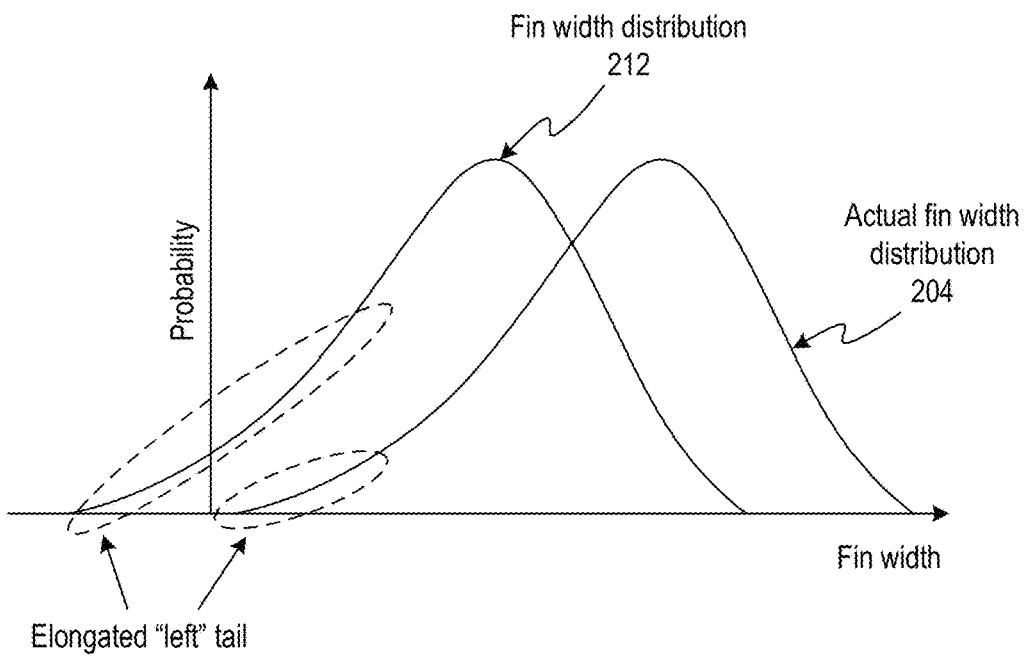
FIG. 2C illustrates a plot of an expected fin width distribution when a nominal fin width is decreased in accordance with some embodiments disclosed herein.

FIG. 2A illustrates a plot of a Gaussian fin width distribution in accordance with some embodiments disclosed herein. In FIGS. 2A-2C, the X-axis represents the fin width, and the Y-axis represents the probability of occurrence of a particular fin width value.

A Gaussian distribution occurs in many natural phenomena. Thus, when a fin is manufactured, it is reasonable to expect that the fin width will have a Gaussian fin width distribution 202 due to random variations that affect lithography and etching. However, the actual fin width distribution that is produced by existing manufacturing processes is not Gaussian.

FIG. 2B illustrates a plot of an actual fin width distribution in accordance with some embodiments disclosed herein. Existing manufacturing processes use chemical etching and thermal oxidation to create fin structures. The actual fin width distribution 204 of fins created using existing manufacturing processes is skewed toward fins that are narrower than the nominal fin width. Fin widths that are significantly wider than the nominal fin width result in transistors with excessive leakage 206, and fin widths that are significantly narrower than the nominal fin width may result in fin collapse 208, which reduces the yield.

FIG. 2C illustrates a plot of an expected fin width distribution when a nominal fin width is decreased in accordance with some embodiments disclosed herein. When fins are created using existing processes, the actual fin width distribution 204 includes an elongated "left" tail 210, which means that a large fraction of fins are significantly narrower than the nominal fin width. Consequently, if the nominal fin width is decreased, the actual fin width distribution generated by existing manufacturing processes shifts to the left (shown as "fin width distribution 212" in FIG. 2C), and the elongated "left" tail 210 causes a substantial reduction in the yield. Thus, in existing manufacturing processes, decreasing the nominal fin width can disproportionately decrease the yield, which, in turn, can disproportionately increase manufacturing costs. It may not be possible to continue using existing semiconductor manufacturing processes to increase the density of 3D devices due to the fin collapse problem.

Embodiments disclosed herein use the following insight: a positive feedback effect (or run-away effect) occurs when the fin is narrow, i.e., a narrow fin causes existing fin etch processes to accelerate and make the fin even narrower.

Specifically, the material properties of the fin change with the fin width. For example, it is known that silicon layers thinner than 5 nm exhibit weaker mechanical strength and wider bandgap. The change in the material properties of narrow fins speeds up chemical etching and thermal oxidation rates, which causes a run-away effect, which, in turn, causes the elongated "left" tail 210.

Embodiments disclosed herein use the following insight: if the positive feedback effect (or run-away effect) is prevented from occurring at narrow fin widths, then the yield problems caused by elongated "left" tail 210 would be prevented, and the fin width may be decreased without affecting the yield significantly.

Specifically, embodiments disclosed herein prevent the positive feedback effect (or run-away effect) by replacing chemical etching and thermal oxidation that are sensitive to silicon surface properties by a self-limiting fin etch process. Examples of a self-limiting fin etch process include, but are not limited to, ALE. A self-limiting fin etch process removes material one monolayer at a time. The positive feedback effect (or run-away effect) is prevented in such self-limiting fin etch processes because the speed at which the material is removed does not depend on the fin width.

Self-limiting fin etch processes may be slower than chemical etching and thermal oxidation, and therefore self-limiting fin etch processes may cause the fin manufacturing cost to increase. However, the higher manufacturing cost is more than compensated by the benefits, which include, but are not limited to: (1) increased yield, (2) more consistent transistor performance and leakage, and (3) enabling further transistor density scaling.

Figure 3:
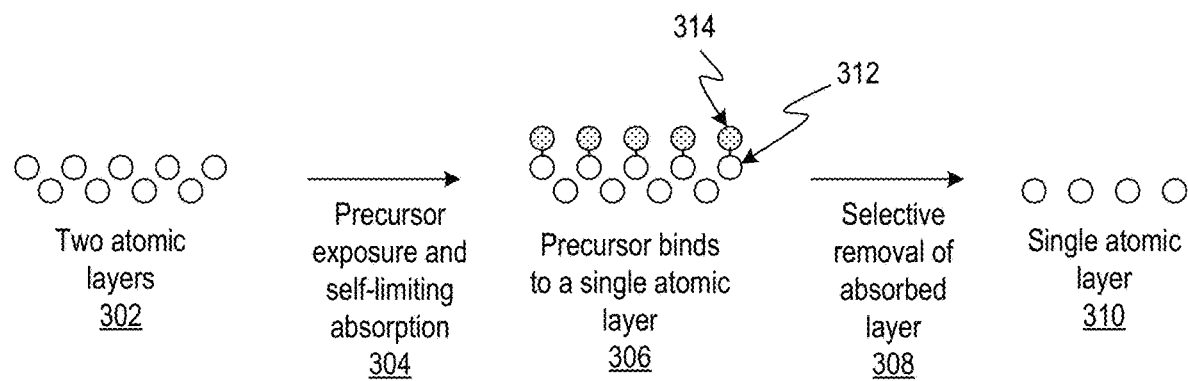
FIG. 3 illustrates an Atomic Layer Etching (ALE) process in accordance with some embodiments disclosed herein.

FIG. 3 illustrates an ALE process in accordance with some embodiments disclosed herein. Two atomic layers 302 are the two outermost layers of a fin. The top layer in two atomic layers 302 may be exposed to a precursor. A precursor may generally be any chemical that binds (e.g., due to a chemical reaction) with the topmost atomic layer. Once the chemical binds with the topmost atomic layer, further absorption is prevented. After precursor exposure and self-limiting absorption 304, the precursor may bind to a single atomic layer 306. As shown in FIG. 3, atoms of the precursor (e.g., atom 314) may bind to the atoms of a single atomic layer of the fin (e.g., atom 312). The precursor absorption process is self-limiting because the absorption process stops after the precursor binds with a single exposed atomic layer, and does not penetrate into deeper atomic layers. Next, a selective removal of the absorbed layer 308 may be performed. Specifically, the selective removal process is self-limiting because the selective removal stops after the single exposed atomic layer of the fin (which is bound to the precursor) is removed, and does not remove deeper atomic layers of the fin. At the end of a single application of the ALE process shown in FIG. 3, the exposed atomic layer from the two atomic layers 302 has been removed, leaving single atomic layer 310. The process shown in FIG. 3 may be repetitively applied to remove more atomic layers, one layer at a time.

Many techniques may be used for implementing self-limiting absorption and self-limiting removal processes. For a silicon substrate, a $Cl_2$ precursor may be used for implementing self-limiting absorption, and Ar ions from an electron cyclotron resonance (ECR) plasma may be used for implementing self-limiting removal. Other possibilities for implementing self-limiting absorption and self-limiting removal include, but are not limited to:

| Substrate material | Chemical used in the self-limiting absorption process | Self-limiting removal process |
| --- | --- | --- |
| III-V: GaAs | One of the following: $Cl_2$ or $Cl_2/Ar$ plasma | One of the following: electron bombardment, low-energy $Ar^+$ ions, 248 nm KrF excimer laser and Ti saffire laser, Ar ions from ECR plasma, or Ne neutral beam. |
| III-V: InP | Tertiarybutyl-phosphine | Halogen lamp desorption |
| III-V: One of the following: InP, InAlAs, or InGaAs | $Cl_2$ | Ne neutral beam |
| One of the following: Ge, Si, or SiGe | $Cl_2$ | Ar ions from ECR plasma |
| Si | One of the following plasmas: $CF_4 + O_2$, $CF_4/O_2$, $NF_3/N_2$, or $F_2/He$ | Ar ions from ECR plasma |
| Si | $Cl_2$ | One of the following: 50 eV Ar ions, Ar ions from helical resonator plasma, Ar ions from helicon plasma, Ar ions from an inductively coupled plasma (ICP) type ion gun, Ar neutral beam, or Ar or He ions from ICP source |
| Si | $Cl_2/Ar$ plasma | Ar ions from ICP source |
| $SiO_2$ (and Si) | $CF_x$ + ions or radical adsorption | Ar ions |
| $SiO_2$ | $C_4F_8/Ar$ plasma | One of the following: Ion bombardment from $C_4F_8/Ar$ ICP plasma, Ar ions from magnetically enhanced plasma, or Ar ions from ICP source |

Figure 4A:
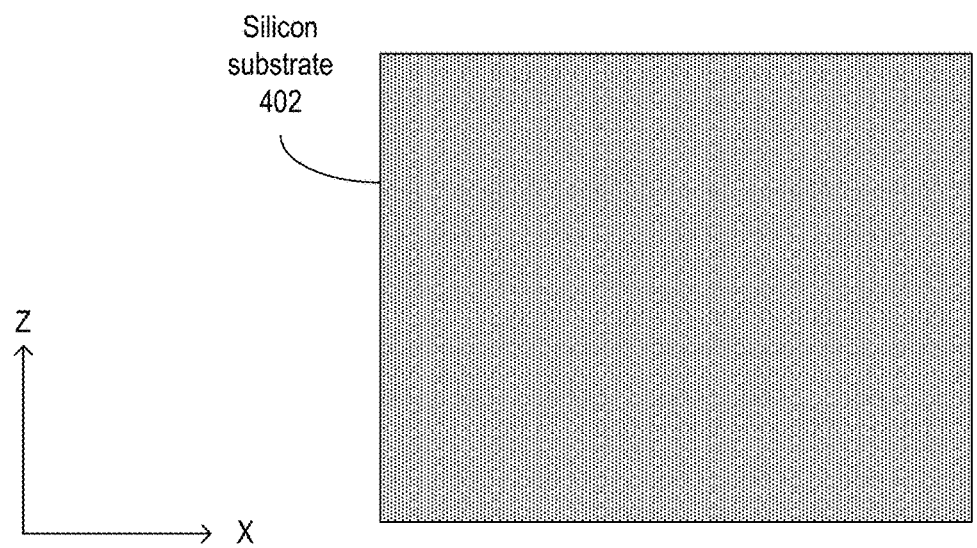
FIGS. 4A-4I illustrate a process for creating fins in accordance with some embodiments described herein.
Figure 4B:
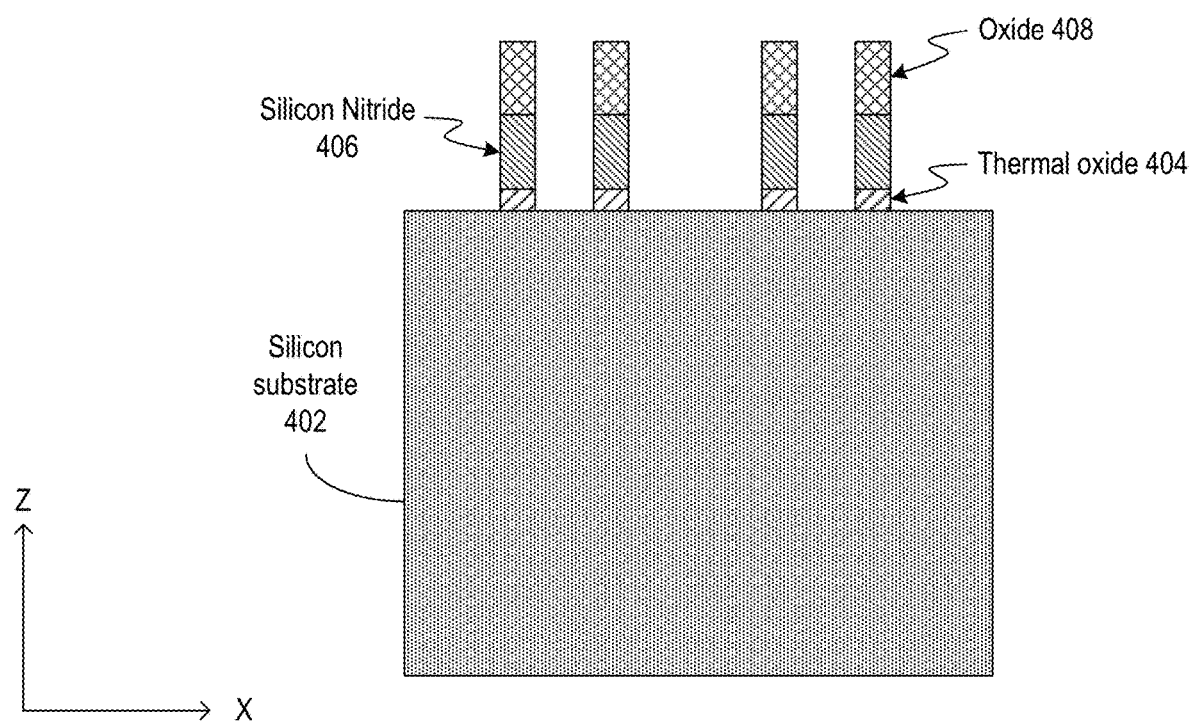
Figure 4C:
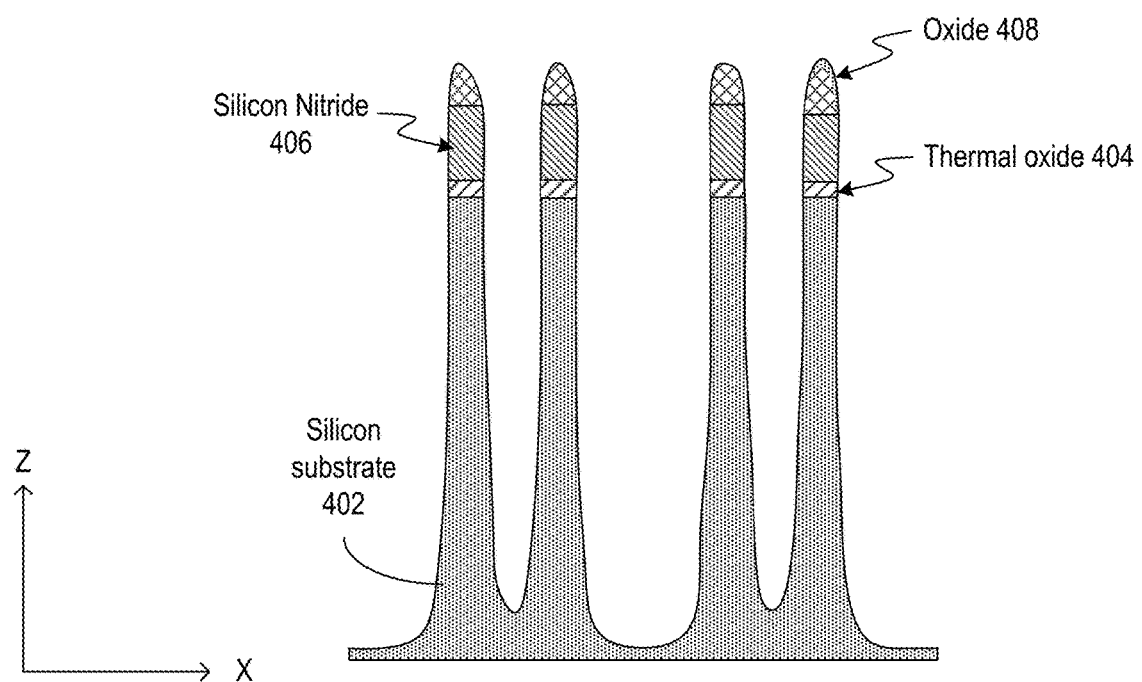
Figure 4D:
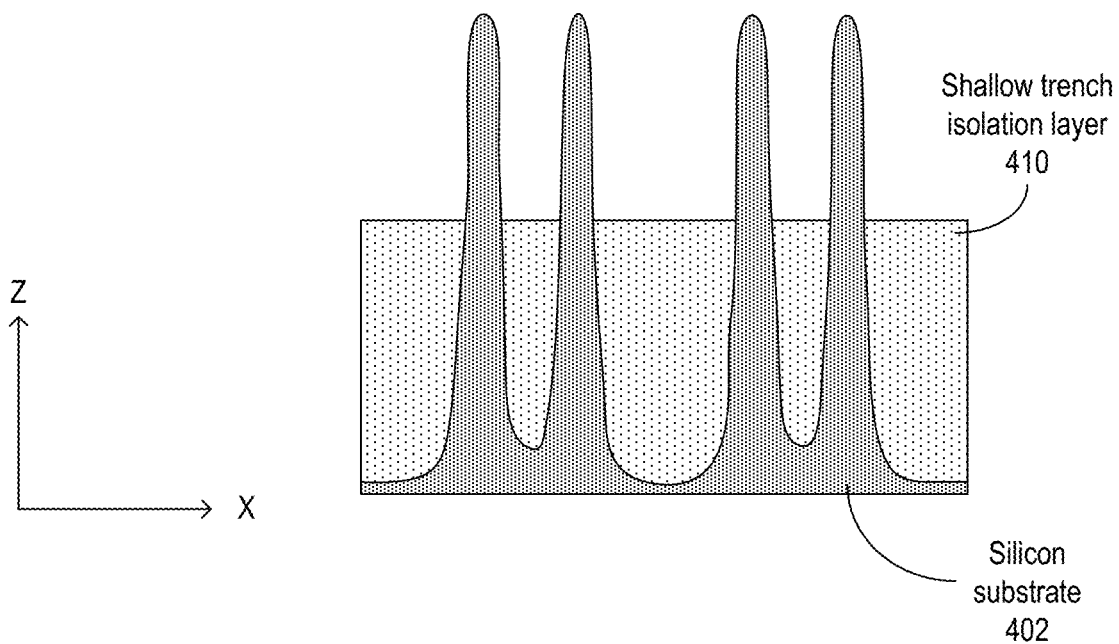
Figure 4E:
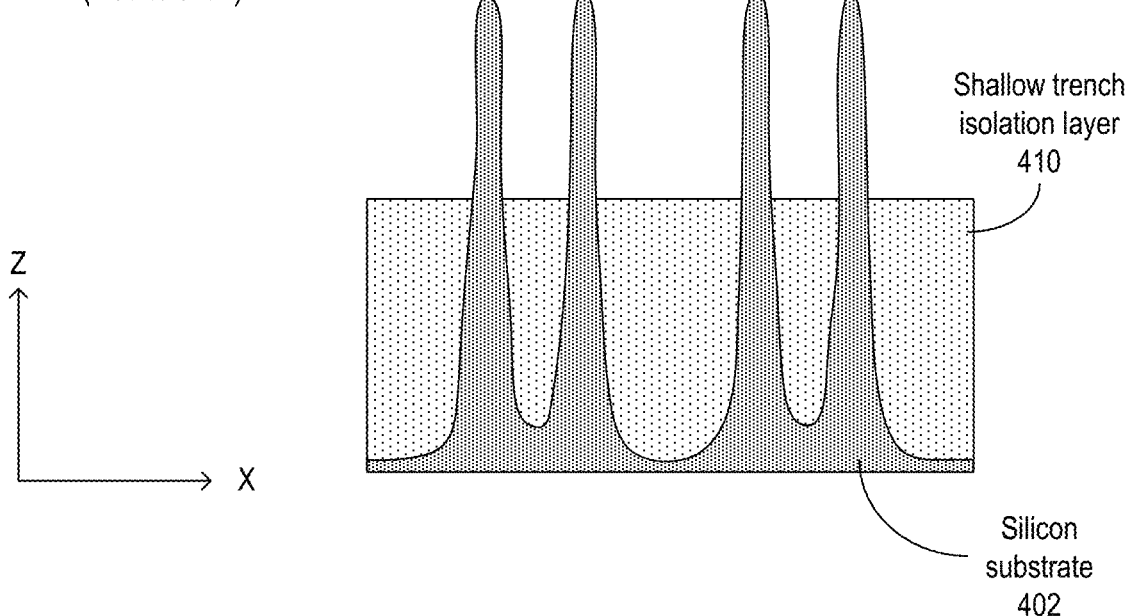
Figure 4F:
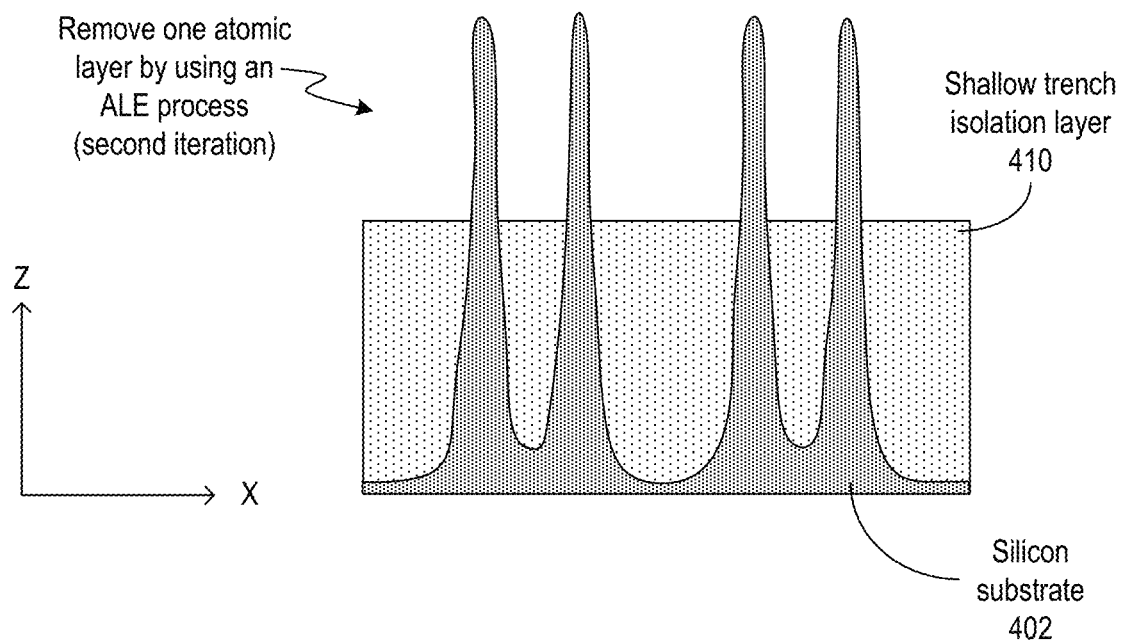
Figure 4G:
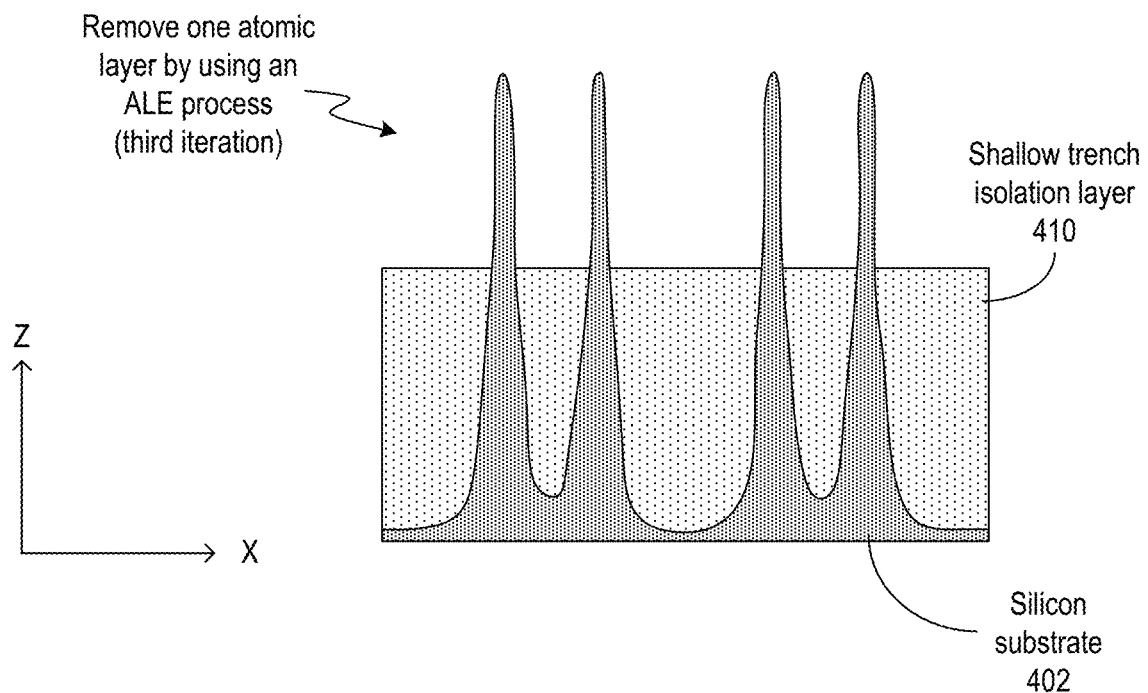
Figure 4H:
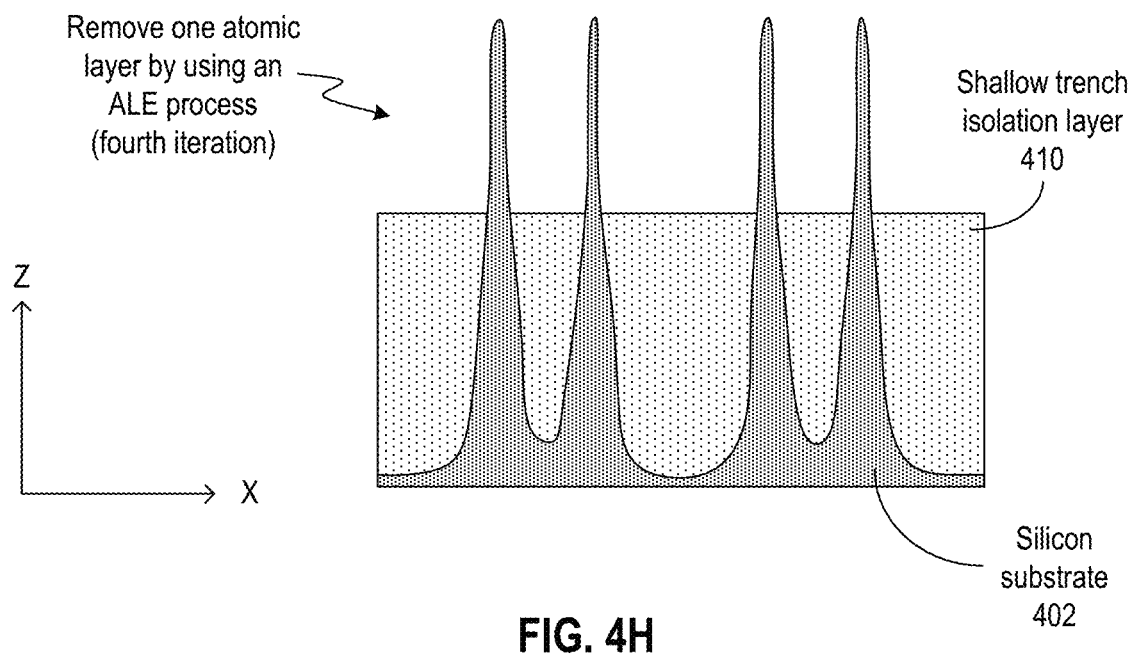
Figure 4I:
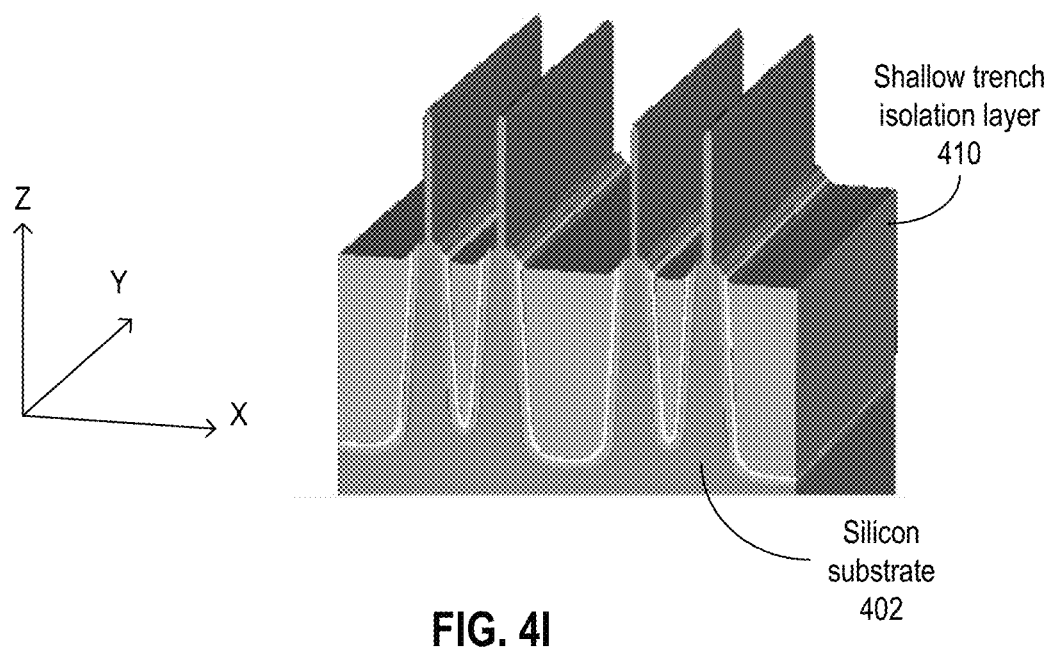

FIGS. 4A-4I illustrate a process for creating fins in accordance with some embodiments described herein. On a silicon substrate 402 (FIG. 4A), the process may begin by forming a fin hardmask pattern (FIG. 4B). Each fin may correspond to a feature on the fin hardmask, and each feature on the fin hardmask may include layers of thermal oxide 404, silicon nitride 406, and oxide 408. Next, the process may use a fin etch process (which may include chemical etching and thermal oxidation) to create initial fin structures as shown in FIG. 4C. The process may then deposit a fin nitride liner (not shown in FIG. 4D) and a shallow trench isolation layer 410 (FIG. 4D). The shallow trench isolation layer may generally use any material that can prevent current leakage between adjacent device components. For example, silicon dioxide may be used as the material for the shallow trench isolation layer. In some embodiments, the height of the shallow trench isolation layer may be comparable to the height of the fins; specifically, the height of the shallow trench isolation layer may be greater than the height of the fins. For example, in some embodiments, the height of the shallow trench isolation layer may be 70 nm, whereas the height of the fin may be 50 nm. Next, as shown in FIGS. 4E-4H, the process may apply one or more iterations of a self-limiting fin etch process (e.g., ALE) to remove one atomic layer of each fin in each iteration. FIG. 4I illustrates an isometric view of the fin shapes after multiple iterations of a self-limiting fin etch process have been applied. Using multiple iterations of the self-limiting fin etch process enables narrow fins to be created without causing fin collapse. Thus, the manufacturing process described in FIGS. 4A-4I may be used to create narrow fins with high yield.

Figure 5:
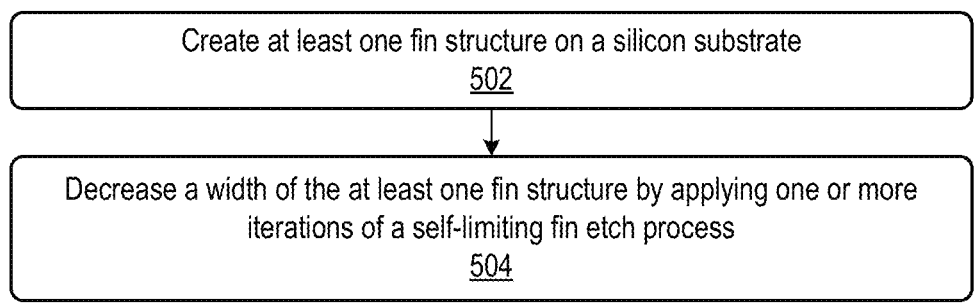
FIG. 5 presents a flowchart that illustrates a process for creating a fin structure on a silicon substrate in accordance with some embodiments disclosed herein.

FIG. 5 presents a flowchart that illustrates a process for creating a fin structure on a silicon substrate in accordance with some embodiments disclosed herein. The process may begin by creating at least one fin structure on a silicon substrate (at 502). Specifically, a fin hardmask pattern may be formed on a silicon substrate (e.g., as shown in FIG. 4B), where each feature on the fin hardmask pattern may include a thermal oxide layer disposed on the silicon substrate (e.g., by growing the thermal oxide layer on the silicon substrate), a silicon nitride layer disposed on the thermal oxide layer, and an oxide layer disposed on the silicon nitride layer. Next, a fin etch process may be used (e.g., as shown in FIG. 4C) to create at least one fin structure on the silicon substrate.

Next, the process for creating the fin structure on the silicon substrate may decrease a width of the at least one fin structure by applying one or more iterations of a self-limiting fin etch process (at 504). Specifically, in each iteration of the self-limiting fin etch process (e.g., as shown in FIG. 3), a self-limiting absorption process may be applied to the at least one fin structure, and then a self-limiting removal process may be applied to the at least one fin structure. Applying the self-limiting absorption process to the at least one fin structure may include exposing the at least one fin structure to a chemical that only binds to an outermost atomic layer of the at least one fin structure. Applying the self-limiting removal process to the at least one fin structure may include removing only an outermost atomic layer of the at least one fin structure. In some embodiments, 10-25 atomic layers (or monolayers) may be removed by using 10-25 iterations of the self-limiting fin etch process, which corresponds to decreasing the width of a fin by approximately 4 nm to 10 nm.

In some embodiments, a gate structure may be created that wraps around the at least one fin structure (e.g., as shown in FIG. 1). In some embodiments, the fin structure may be part of a FinFET device. In some embodiments, the fin structure may be part of a GAA device.

Figure 6:
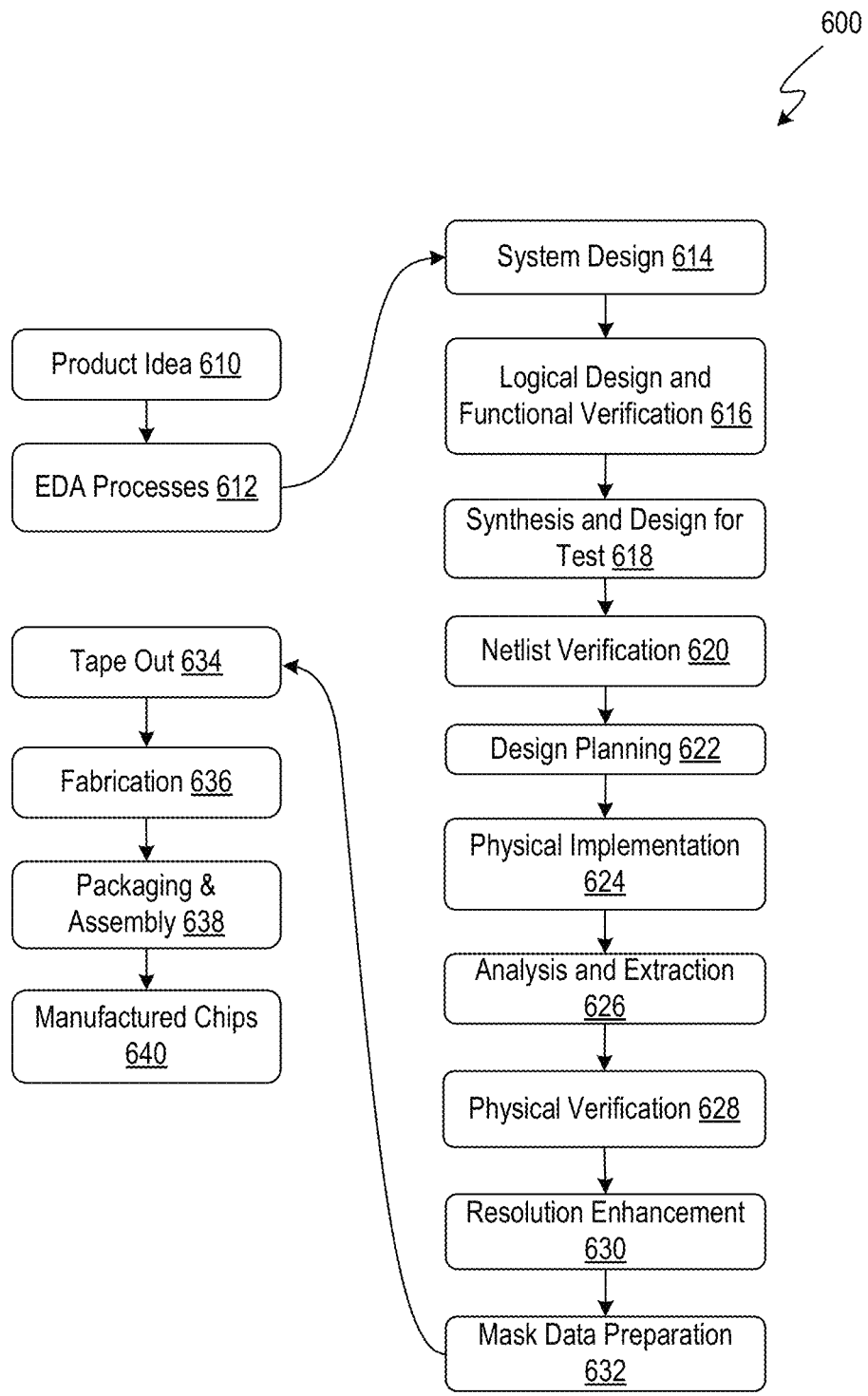
FIG. 6 illustrates an example flow for the design, verification, and fabrication of an integrated circuit in accordance with some embodiments described herein.

FIG. 6 illustrates an example flow 600 for the design, verification, and fabrication of an integrated circuit in accordance with some embodiments described herein. EDA processes 612 (the acronym "EDA" refers to "Electronic Design Automation") can be used to transform and verify design data and instructions that represent the integrated circuit. Each of these processes can be structured and enabled as multiple modules or operations.

Flow 600 can start with the creation of a product idea 610 with information supplied by a designer, information which is transformed and verified by using EDA processes 612. When the design is finalized, the design is taped-out 634, which is when artwork (e.g., geometric patterns) for the integrated circuit is sent to a fabrication facility to manufacture the mask set, which is then used to manufacture the integrated circuit. After tape-out, a semiconductor die is fabricated 636 and packaging and assembly 638 are performed to produce the manufactured IC chip 640.

Specifications for a circuit or electronic structure may range from low-level transistor material layouts to high-level description languages. A high-level of abstraction may be used to design circuits and systems, using a hardware description language ("HDL") such as VHDL, Verilog, SystemVerilog, SystemC, MyHDL or OpenVera. The HDL description can be transformed to a logic-level register transfer level ("RTL") description, a gate-level description, a layout-level description, or a mask-level description. Each lower abstraction level that is a less abstract description adds more detail into the design description. The lower levels of abstraction that are less abstract descriptions can be generated by a computer, derived from a design library, or created by another design automation process. An example of a specification language at a lower level of abstraction language for specifying more detailed descriptions is SPICE (which stands for "Simulation Program with Integrated Circuit Emphasis"). Descriptions at each level of abstraction contain details that are sufficient for use by the corresponding tools of that layer (e.g., a formal verification tool).

During system design 614, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 616, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 618, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 620, the netlist is checked for compliance with timing constraints and for correspondence with the HDL code. During design planning 622, an overall floor plan for the integrated circuit is constructed and analyzed for timing and top-level routing.

During layout or physical implementation 624, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 626, the circuit function is verified at the layout level, which permits refinement of the layout design. During physical verification 628, the layout design is checked to ensure that manufacturing constraints are correct, such as DRC constraints, electrical constraints, lithographic constraints, and that circuitry function matches the HDL design specification. During resolution enhancement 630, the geometry of the layout is transformed to improve how the circuit design is manufactured.

During tape-out, data is created to be used (after lithographic enhancements are applied if appropriate) for production of lithography masks. During mask data preparation 632, the 'tape-out' data is used to produce lithography masks that are used to produce finished integrated circuits.

A storage subsystem of a computer system (such as computer system 700 of FIG. 7) may be used to store the programs and data structures that are used by some or all of the EDA products described herein, and products used for development of cells for the library and for physical and logical design that use the library.

Figure 7:
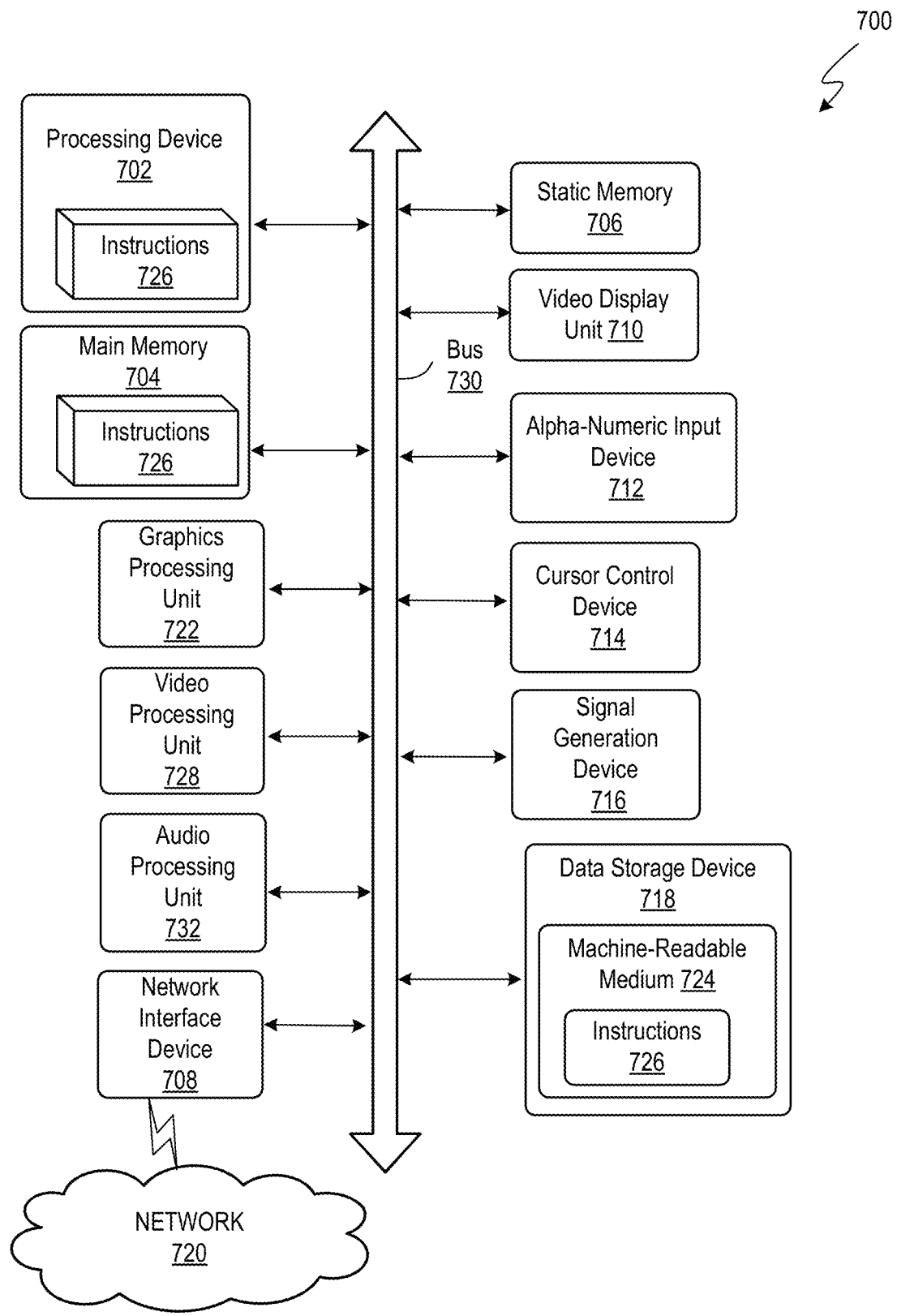
FIG. 7 illustrates an example machine of a computer system 700 within which a set of instructions, for causing the machine to perform any one or more of the methodologies discussed herein, may be executed.

FIG. 7 illustrates an example machine of a computer system 700 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM), a static memory 706 (e.g., flash memory, static random access memory (SRAM), etc.), and a data storage device 718, which communicate with each other via a bus 730.

Processing device 702 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 may also be one or more special-purpose processing devices such as an application specific integrated circuit (ASIC), a field programmable gate array (FPGA), a digital signal processor (DSP), network processor, or the like. The processing device 702 may be configured to execute instructions 726 for performing the operations and steps described herein.

The computer system 700 may further include a network interface device 708 to communicate over the network 720. The computer system 700 also may include a video display unit 710 (e.g., a liquid crystal display (LCD) or a cathode ray tube (CRT)), an alphanumeric input device 712 (e.g., a keyboard), a cursor control device 714 (e.g., a mouse), a graphics processing unit 722, a signal generation device 716 (e.g., a speaker), graphics processing unit 722, video processing unit 728, and audio processing unit 732.

The data storage device 718 may include a machine-readable storage medium 724 (also known as a non-transitory computer-readable medium) on which is stored one or more sets of instructions 726 or software embodying any one or more of the methodologies or functions described herein. The instructions 726 may also reside, completely or at least partially, within the main memory 704 and/or within the processing device 702 during execution thereof by the computer system 700, the main memory 704 and the processing device 702 also constituting machine-readable storage media.

In some implementations, the instructions 726 include instructions to implement functionality corresponding to the present disclosure. While the machine-readable storage medium 724 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 702 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method, comprising:
    creating at least one fin structure on a silicon substrate; and
    decreasing a width of the at least one fin structure by applying one or more iterations of a self-limiting fin etch process, wherein each iteration of the self-limiting fin etch process decreases the width of the at least one fin structure to a desired width by only one atomic layer, and wherein the desired width prevents fin collapse and current leakage in the at least one fin structure.

2. The method of claim 1, wherein each iteration of the self-limiting fin etch process comprises:
    applying a self-limiting absorption process to the at least one fin structure; and
    applying a self-limiting removal process to the at least one fin structure.

3. The method of claim 2, wherein the applying the self-limiting absorption process to the at least one fin structure comprises exposing the at least one fin structure to a chemical that only binds to an outermost atomic layer of the at least one fin structure.

4. The method of claim 2, wherein the applying the self-limiting removal process to the at least one fin structure comprises removing an outermost atomic layer of the at least one fin structure without removing another atomic layer under the outermost atomic layer.

5. The method of claim 1, further comprising creating a gate structure that wraps around the at least one fin structure.

6. The method of claim 1, wherein the at least one fin structure is part of a Fin Field Effect Transistor (FinFET) device.

7. The method of claim 1, wherein the at least one fin structure is part of a Gate All Around (GAA) device.

8. A method for creating three-dimensional devices, comprising:
- forming a fin hardmask pattern on a silicon substrate;
- using a fin etch process to create at least one fin structure on the silicon substrate; and
- decreasing a width of the at least one fin structure by applying one or more iterations of a self-limiting fin etch process, wherein each iteration of the self-limiting fin etch process decreases the width of the at least one fin structure to a desired width by only one atomic layer, and wherein the desired width prevents fin collapse and current leakage in the at least one fin structure.

9. The method of claim 8, wherein each iteration of the self-limiting fin etch process comprises:
- applying a self-limiting absorption process to the at least one fin structure; and
- applying a self-limiting removal process to the at least one fin structure.

10. The method of claim 9, wherein the applying the self-limiting absorption process to the at least one fin structure comprises exposing the at least one fin structure to a chemical that only binds to an outermost atomic layer of the at least one fin structure.

11. The method of claim 9, wherein the applying the self-limiting removal process to the at least one fin structure comprises removing only an outermost atomic layer of the at least one fin structure.

12. The method of claim 8, further comprising creating a gate structure that wraps around the at least one fin structure.

13. The method of claim 8, wherein the at least one fin structure is part of a Fin Field Effect Transistor (FinFET) device.

14. The method of claim 8, wherein the at least one fin structure is part of a Gate All Around (GAA) device.

15. A method for creating a fin structure on a silicon substrate, comprising:
- forming a fin hardmask pattern on the silicon substrate, wherein a feature on the fin hardmask pattern comprises a thermal oxide layer grown on the silicon substrate, a silicon nitride layer disposed on the thermal oxide layer, and an oxide layer disposed on the silicon nitride layer;
- using a fin etch process to create the fin structure on the silicon substrate corresponding to the feature on the fin hardmask pattern; and
- decreasing a width of the fin structure by applying one or more iterations of a self-limiting fin etch process, wherein each iteration of the self-limiting fin etch process decreases the width of the at least one fin structure to a desired width by only one atomic layer, and wherein the desired width prevents fin collapse and current leakage in the at least one fin structure.

16. The method of claim 15, wherein each iteration of the self-limiting fin etch process comprises:
- applying a self-limiting absorption process to the at least one fin structure; and
- applying a self-limiting removal process to the fin structure.

17. The method of claim 16, wherein the applying the self-limiting absorption process to the at least one fin structure comprises exposing the fin structure to a chemical that only binds to an outermost atomic layer of the fin structure.

18. The method of claim 16, wherein the applying the self-limiting removal process to the fin structure comprises removing only an outermost atomic layer of the fin structure.

19. The method of claim 15, further comprising creating a gate structure that wraps around the fin structure.

20. The method of claim 15, wherein the fin structure is part of a Fin Field Effect Transistor (FinFET) device.

* * * * *